United States Patent
Burnham et al.

(10) Patent No.: US 9,818,499 B2
(45) Date of Patent: Nov. 14, 2017

(54) ELECTRICALLY CONDUCTIVE MATERIALS FORMED BY ELECTROPHORESIS

(75) Inventors: Kenneth Burnham, Warren, MA (US); Richard Skov, Spencer, MA (US)

(73) Assignee: FLEXcon Company, Inc., Spencer, MA (US)

( * ) Notice: Subject to any disclaimer, the term of this patent is extended or adjusted under 35 U.S.C. 154(b) by 0 days.

(21) Appl. No.: 13/272,527

(22) Filed: Oct. 13, 2011

(65) Prior Publication Data

US 2013/0092881 A1    Apr. 18, 2013

(51) Int. Cl.
*H01B 1/24* (2006.01)
*C09J 9/02* (2006.01)
*H05K 1/09* (2006.01)
*B82Y 30/00* (2011.01)

(52) U.S. Cl.
CPC .................. *H01B 1/24* (2013.01); *C09J 9/02* (2013.01); *H05K 1/095* (2013.01); *B82Y 30/00* (2013.01); *H05K 2201/026* (2013.01); *H05K 2201/0245* (2013.01); *H05K 2201/0323* (2013.01); *H05K 2203/105* (2013.01); *H05K 2203/1136* (2013.01)

(58) Field of Classification Search
CPC .......... H01B 1/24; B82Y 30/00; B82Y 40/00; H01L 29/0665; B29C 71/0081; H05K 2203/105; C01B 2202/08
USPC .................................................. 252/510, 511
See application file for complete search history.

(56) References Cited

U.S. PATENT DOCUMENTS

| | | | |
|---|---|---|---|
| 4,170,677 A | * | 10/1979 | Hutcheson .................... 428/119 |
| 4,188,449 A | | 2/1980 | Lu et al. |
| 4,417,174 A | | 11/1983 | Kamijo et al. |
| 4,548,862 A | | 10/1985 | Hartman |
| 4,687,968 A | | 8/1987 | Frayer |
| 4,816,717 A | | 3/1989 | Harper et al. |
| 4,852,571 A | | 8/1989 | Gadsby et al. |
| 5,082,595 A | | 1/1992 | Glackin |
| 5,321,069 A | | 6/1994 | Owens |

(Continued)

FOREIGN PATENT DOCUMENTS

| CN | 85105901 A | 1/1987 |
|---|---|---|
| CN | 1871537 A | 11/2006 |

(Continued)

OTHER PUBLICATIONS

Prasse et al "Electric anisotropy of carbon nanofibre/epoxy resin composites due to electric field induced alignment", Composites Sci and Tech 63(2003) 1835-1841.*

(Continued)

*Primary Examiner* — Mark Kopec
(74) *Attorney, Agent, or Firm* — Gesmer Updegrove LLP

(57) ABSTRACT

A method of forming an electrically conductive composite is disclosed that includes the steps of providing a first dielectric material and a second conductive material that is substantially dispersed within the first dielectric material; and applying an electric field through at least a portion of the combined first dielectric material and second conductive material such that the second conductive material undergoes electrophoresis and forms at least one electrically conductive path through the electrically conductive composite along the direction of the applied electric field.

19 Claims, 7 Drawing Sheets

(56) References Cited

U.S. PATENT DOCUMENTS

| | | | |
|---|---|---|---|
| 5,409,777 | A | 4/1995 | Kennedy et al. |
| 5,479,070 | A | 12/1995 | Murakami |
| 5,552,679 | A | 9/1996 | Murasko |
| 5,800,685 | A | 9/1998 | Perrault |
| 5,821,691 | A | 10/1998 | Richie et al. |
| 5,906,720 | A | 5/1999 | Ferguson et al. |
| 5,929,167 | A * | 7/1999 | Gerard .................. C08G 18/12 524/270 |
| 6,121,508 | A | 9/2000 | Bischof et al. |
| 6,198,216 | B1 | 3/2001 | Kosa et al. |
| 6,207,077 | B1 | 3/2001 | Burnell-Jones |
| 6,432,516 | B1 | 8/2002 | Terashima et al. |
| 6,518,359 | B1 * | 2/2003 | Clemens ............ C08G 18/0823 428/355 N |
| 7,169,250 | B2 * | 1/2007 | Kim et al. .................... 156/290 |
| 7,651,638 | B2 | 1/2010 | Segall et al. |
| 7,981,495 | B2 * | 7/2011 | Kim et al. ..................... 428/86 |
| 2001/0038925 | A1 | 11/2001 | Barton et al. |
| 2003/0102154 | A1 | 6/2003 | Haba |
| 2007/0035808 | A1 | 2/2007 | Amundson et al. |
| 2009/0005667 | A1 | 1/2009 | Cui et al. |
| 2009/0038832 | A1 | 2/2009 | Chaffins et al. |
| 2009/0224422 | A1 * | 9/2009 | Dubin .......................... 264/259 |
| 2010/0016702 | A1 | 1/2010 | Greene et al. |
| 2010/0036230 | A1 | 2/2010 | Greene et al. |
| 2012/0145315 | A1 * | 6/2012 | Knaapila et al. .......... 156/273.9 |
| 2012/0224285 | A1 | 9/2012 | Svasand et al. |

FOREIGN PATENT DOCUMENTS

| | | | |
|---|---|---|---|
| JP | S62-022383 | A | 1/1987 |
| JP | 2257590 | | 6/1990 |
| JP | H04-503831 | A | 7/1992 |
| JP | 7011247 | | 1/1995 |
| JP | 2000260561 | | 9/2000 |
| NO | 20092381 | A | 12/2010 |
| WO | 9111493 | A2 | 8/1991 |
| WO | 0029493 | | 5/2000 |
| WO | 0174119 | | 10/2001 |
| WO | 0219020 | | 3/2002 |
| WO | 2010/151141 | A1 * | 12/2010 |
| WO | 2010151141 | A1 | 12/2010 |
| WO | 2010151142 | A1 | 12/2010 |
| WO | 2010151148 | A1 | 12/2010 |
| WO | 2012076612 | A1 | 6/2012 |
| WO | 2012081991 | A1 | 6/2012 |
| WO | 2012081992 | A2 | 6/2012 |
| WO | 2012085084 | A3 | 6/2012 |
| WO | 2012085105 | A1 | 6/2012 |

OTHER PUBLICATIONS

Kim "Thermo-physical responses of polymeric composites tailored by electric field", Composites Sci and Tech 65(2005) 1728-1735.*
Huntsman Advanced Materials "RenLam CY 219 / Ren HY 5160 or HY 5161 or HY 5162" data sheet Jul. 3, 1007.*
Solid surface energy data (SFE) for common polymers, www.surface-tension.de/solid-surface-energy.htm, retrieved Sep. 1, 2010, 2 pages.
Allred, Ronald E., "Surface Modification of Exfoliated Graphite Nano-Reinforcements", Proc. 38th th SAMPE Tech. Conf., 2006, 14 pages.
International Search Report and Written Opinion mailed on Feb. 25, 2014 in connection with International Application PCT/US2012/059650, 13 pages.
First Office Action issued by the State Intellectual Property Office of the People's Republic of China on Nov. 24, 2015 in connection with related Chinese Patent Application No. 201280056619.3 and English translation thereof, 23 pages.
European Patent Office Communication Pursuant to Article 161(1) and 162 EPC dated Jul. 18, 2014 in connection with European Application No. 12788335.3, 2 pages.
International Preliminary Report on Patentability dated Apr. 24, 2014 in connection with International Application No. PCT/US2012/059650, 10 pages.
First Examination Report issued by the Australian Patent Office dated Apr. 20, 2015 in connection with related Australian Patent Application No. 2012322863, 4 pages.
Kim G., "Thermo-physical responses of polymeric composites tailored by electric field", Composites Science and Technology, vol. 65, Issues 11-12, Sep. 2005, pp. 1728-1735.
Prasse T. et al., "Electric anisotropy of carbon nanofibre/epoxy resin composites due to electric field induced alignment", Composites Science and Technology, vol. 63, Issue 13, Oct. 2003, pp. 1835-1841.
Examiner's Report issued by the Canadian Intellectual Property Office dated Jun. 5, 2015 in connection with related Canadian Patent Application No. 2,852,023, 3 pages.
Office Action issued by the Japanese Patent Office dated Jun. 30, 2015 in connection with related Japanese Patent Application No. 2014-535851 and partial English translation thereof, 8 pages.
Office Action issued by the Korean Intellectual Property Office dated Jun. 22, 2015 in connection with related Korean Patent Application No. 10-2014-7012862 and English translation thereof, 15 pages.
International Search Report and Written Opinion dated Apr. 3, 2013 in connection with International Application PCT/US2012/059654, 11 pages.
Notice of Final Rejection dated Apr. 25, 2016 in connection with related Korean application No. 10-2014-7012862.
Examinees Report dated Aug. 11, 2016 in connection with related Canadian patent application No. 2,852,023.
Second Examination Report issued by the Australian Patent Office dated Jan. 29, 2016 in connection with related Australian Patent Application No. 2012322863, 5 pages.
Notice of Final Rejection dated Sep. 2, 2016 in connection with related Korean Application No. 10-2014-7012862.
Extended European Search Report issued by the European Patent Office dated Mar. 21, 2017 in related Application No. 16188209.7-1373.
Office Action issued by the Korean Patent Office dated Mar. 14, 2017 in related Application No. 10-2016-7034054.
Office Action issued by State Intellectual Property Office in related Chinese Patent Application No. 201280056619.3 dated Sep. 8, 2016.
Office Action issued by State Intellectual Property Office in related Chinese Patent Application No. 201280056619.3 dated Mar. 8, 2017.

* cited by examiner

ELECTRICALLY CONDUCTIVE MATERIALS FORMED BY ELECTROPHORESIS

BACKGROUND

The invention generally relates to conductive polymeric and elastomeric materials for use in a wide variety of applications, including without limitation, conductive adhesives, conductive gaskets and conductive films.

The design of an electrically conductive pressure sensitive adhesive (PSA), for example, for has long presented challenges at least because adhesive strength and flexibility generally decrease with increased electrical conductivity. The materials that are typically used (added) to provide good electrical conductivity are generally less flexible and inhibit adhesion. A conventional way to prepare a conductive coating is to fill a polymeric material with conductive particles, e.g., graphite, silver, copper, etc., then coat, dry and cure the polymeric binder. In these cases the conductive particles are in such a concentration that there is a conductive network formed when the particles are each in physical contact with at least one other neighboring particle. In this way, a conductive path is provided through the composite.

For pressure sensitive adhesives, however, if the particle concentration is high enough to form a network in which particle-to-particle contact is maintained then there is little chance that the polymer (e.g., elastomer) system of the PSA component is present in high enough concentrations to flow out to make surface-to-surface contact between the substrates and an electrode, i.e., act as an adhesive. Conversely, if the PSA component is sufficient concentration to make sufficient surface contact to the substrate, it would have to interrupt adjacent conductive particles such that particle-to-particle contact is disrupted.

Another type of electrically conductive PSA includes conductive spherical particles with diameters equal to or greater than the thickness of the PSA. In this fashion the signal or current may be carried along the surface of the particles, thus providing current flow anisotropically in the z dimension of the adhesive. The continuity of the adhesive however, may be compromised.

Salts, such as sodium or potassium chloride, readily dissolve when in an aqueous medium, and their ions dissociate (separate into positive and negative ions). The dissociated ions may then convey an electrical current or signal. For this reason, salts have long been added to water, which then may be added to polymeric and elastomeric materials, to provide good electrical conductivity. For example, U.S. Pat. No. 6,121,508 discloses a pressure sensitive adhesive hydrogel for use in a biomedical electrode. The gel material is disclosed to include at least water, potassium chloride and polyethylene glycol, and is disclosed to be electrically conductive. U.S. Pat. No. 5,800,685 also discloses an electrically conductive adhesive hydrogel that includes water, salt, an initiator or catalyst and a cross linking agent. The use of such hydrogels however, also generally requires the use of a conductive surface at one side of the hydrogel (away from the patient) that is capable of receiving the ionically conductive charge, such as silver / silver chloride, which is relatively expensive.

While these hydrogel/adhesives can have good electrically conductive properties, they often have only fair adhesion properties. Another downside is that the electrical conductivity changes with changing water content, such as changes caused by evaporation, requiring that the hydrogels be maintained in a sealed environment prior to use, and then used for a limited period of time only due to evaporation.

U.S. Pat. No 7,651,638 discloses a water insensitive alternating current responsive composite that includes a polymeric material and a polar material (such as an organo salt) that is substantially dispersed within the polymeric material. The polymeric material and the polar material are chosen such that they each exhibit a mutual attraction that is substantially the same as the attraction to itself. Because of this, the polar material neither clumps together nor blooms to a surface of the polymeric material, but remains suspended within the polymeric material. This is in contrast to the use of salts in other applications that is intended to bloom to the surface (to provide a conductive layer along a surface, e.g., for static discharge)

The composites of U.S. Pat. No. 7,651,638, however, remain dielectrics and have high resistance, and are therefore not suitable for use in certain applications, such as providing electrical stimulus to a human subject (such as is required during defibrillation and/or Transcutaneous Electrical Nerve Stimulation, etc.) due to the high resistance of the material. While such composites may be used for detecting small biological electric signals from a patient, a problem therefore, can arise when a patient undergoes a defibrillation procedure because the high resistance could prevent the charge overload from dissipating in a timely enough fashion as per AAMI EC12-2000-4.2.2.4, which is directed to defibrillation overload recovery (DOR). This failure to dissipate the charge may lead to uncertainty as to whether or not the defibrillation procedure has corrected the distress and therefore whether any further charge needs to be given to the patient.

U.S. Pat. No. 5,082,595 discloses an electrically conductive pressure sensitive adhesive that includes carbon particles, and the conductive adhesive is disclosed to be prepared by incorporating black filler (carbon) into the pressure sensitive adhesive in such a manner as to impart electrical conductivity, yet have a concentration low enough to avoid adversely affecting the physical properties (such as tack) of the adhesive. In particular, this patent states that a slurry of the carbon black in an organic solvent is formed under mild agitation or stirring in the absence of high shear to preserve the structures carbon black may form and to improve wetting of the carbon black. Such a composite, however, may not provide sufficient adhesiveness and conductivity in certain applications. Nor may such structures be discreetly placed to form conduction sites only at specific locations within a continuous adhesive.

There remains a need therefore, for a composite for use as a conductive polymeric material that provides electrical conductivity without compromising the desired properties of the polymeric material.

SUMMARY

In accordance with an embodiment, the invention provides a method of forming an electrically conductive composite comprising the steps of providing a first dielectric material and a second conductive material that is substantially dispersed within the first dielectric material; and applying an electric field through at least a portion of the combined first dielectric material and second conductive material such that the second conductive material undergoes electrophoresis and forms at least one electrically conductive path through the composite along the direction of the applied electric field.

In accordance with another embodiment, the invention provides an electrically conductive material comprising a dielectric material and conductive particles within the dielectric material, wherein the conductive particles are aligned to form conductive paths through the composite by electrophoresis.

In accordance with further embodiments, the dielectric material may be a pressure sensitive adhesive, the conductive particles may be formed of any of carbon powder, flakes, granules or nanotubes, and the conductive particles may have densities within the range of about 0.35 g/cm³ and about 1.20 Wcm³.

BRIEF DESCRIPTION OF THE DRAWINGS

The following description may be further understood with reference to the accompanying drawings in which.

The drawings are shown for illustrative purposes only and are not to scale.

DETAILED DESCRIPTION

Applicants have discovered that conductive materials may be formed by electrophoresis whereby conductive particles (e.g., 5% by weight carbon particles) within a dielectric material (e.g., a pressure sensitive adhesive) migrate when subjected to an electric field by aligning with the field to form conductive pathways through the composite.

The requirements for the dielectric material (e.g., polymeric material) and the conductive material include that the materials interact in such a way that the conductive material does not bloom to a surface of the binder material. If conductive material has a surface energy greater than that of the dielectric material, then the conductive material should remain suspended within the dielectric material yet not be in sufficient concentrations to provide particle-to-particle electrical conductivity through the material prior to the application of an electric field.

Figure 1:
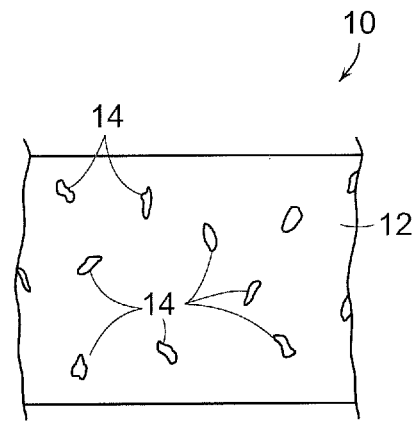
FIG. 1 shows an illustrative diagrammatic view of a composite in accordance with an embodiment of the invention prior to electrophoresis.

FIG. 1 for example, shows a composite 10 in accordance with an embodiment of the invention that includes a dielectric material 12 and conductive particles 14 dispersed within the dielectric material 12. This may be achieved, for example, by introducing the conductive material (while dispersed in an evaporative continuous liquid phase) into the liquid polymeric material and then permitting the liquid phase of the dispersion of conductive particles to evaporate leaving the conductive material within the polymeric material. In accordance with an embodiment of the invention, the polymeric material may, for example, be an acrylic adhesive such as may be represented as

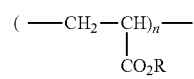

Where R may vary and may be any of an ethyl, or a butyl or a 2-ethylhexyl or other organic moiety, and n is a number of repeating units. For example, the polymeric material may be a FLEXcon V95 pressure sensitive adhesive as sold by FLEXcon Company, Inc. of Spencer, MA.

Figure 2:
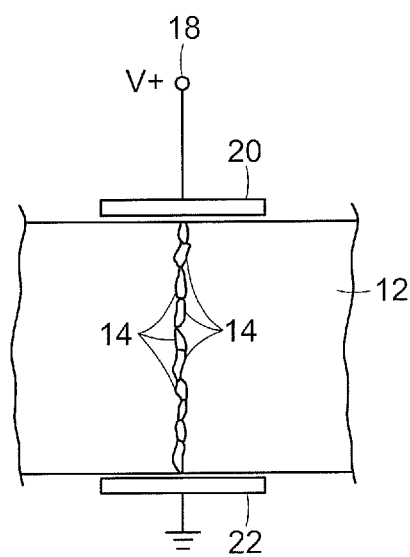
FIG. 2 shows an illustrative diagrammatic view of the composite of FIG. 1 in the presence of an electric field sufficient to cause electrophoresis in the composite.
Figure 3:
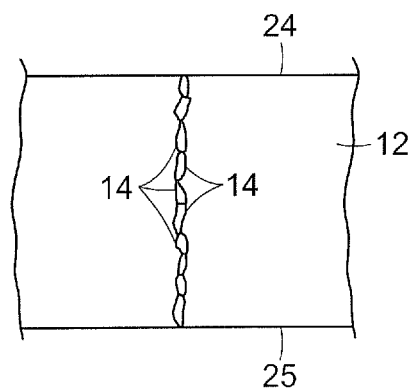
FIG. 3 shows an illustrative diagrammatic view of the composite of FIG. 2 after the electric field has been applied and removed.
Figure 4:
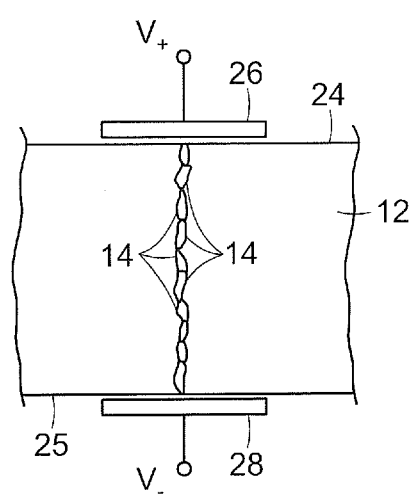
FIG. 4 shows an illustrative diagrammatic view of the composite of FIG. 3 used for conducting electricity from one side of the composite to the other side of the composite.

As shown in FIG. 2, when an electric field 18 (e.g., 5, 10, 50, 100, 200 volts or higher AC or DC) is applied to the composite at conductors 20, 22, the conductive particles 14 undergo electrophoresis and will align with the electric field, forming a conductive path through the composite. As shown in FIG. 3, when the field is removed, the conductive particles 14 remain in place forming the conductive path. The composite may then be used to conduct electricity between, for example conductors 26 and 28 as shown in FIG. 4.

The conductive particles should have a surface energy that is at least slightly greater than that of the dielectric material to ensure that the dielectric material sufficiently wets the surface of the conductive particles. The density and surface area of the conductivity of the particles 14 are important considerations. Applicants have found, for example, that carbon (e.g., graphite powder, flakes, granules, nanotubes etc.) having densities in the range of, for example, about 0.35 g/cm³ to about 1.20 g/cm³, and preferably between about 0.5 g/cm³ to 1.0 g/cm³, are suitable for use as the conductive material. The surface energy of the graphite is, again, preferably higher than that of the dielectric to ensure sufficient wetting of the surfaces of the particles 14. In the above example, the graphite particles have a specific surface energy of 55 dynes/cm and the dielectric disclosed above has a surface energy of a little less than 40 dynes/cm.

Figure 5A:
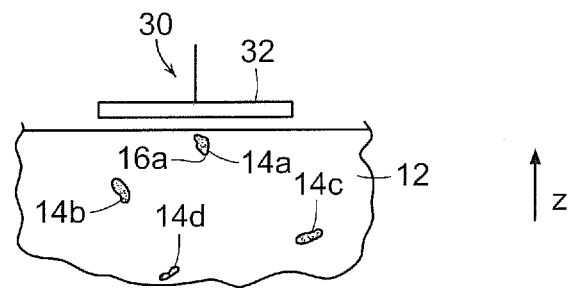
FIGS. 5A-5C show illustrative diagrammatic views of the composite of FIG. 1 at successive moments after a direct current (DC) overcharge electric field is applied showing the electrophoresis activity.
Figure 5B:
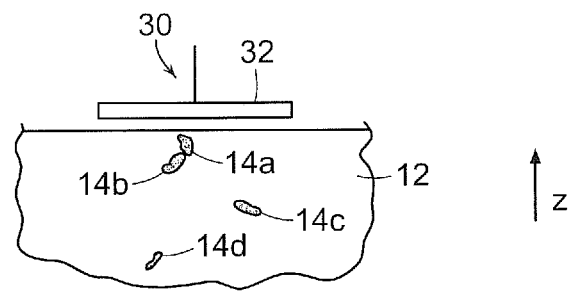
Figure 5C:
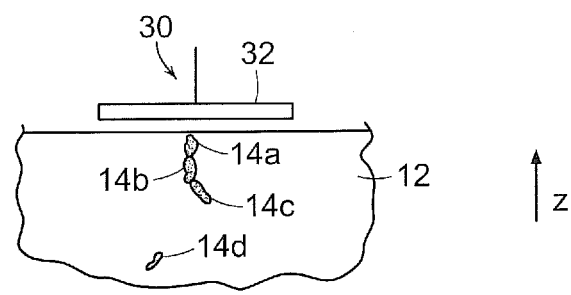

FIGS. 5A-5C show the process of the electrophoresis that occurs upon overcharging in more detail. As shown in FIG. 5A, when a DC voltage potential is applied, e.g., 5, 10, 50, 100 or 200 volts or higher, a particle 14a that is near the surface aligns in the z-direction. Once this occurs, the inner end 16a of the particle 14a is now closer to the opposing surface (as also shown in FIG. 5A), causing the charge on the inner end 16a to be slightly higher than the charge on the surrounding inner surface of the composite. This causes another nearby particle 14b to be attracted to the inner end 16a of the particle 14a as shown in FIG. 5B. The inner end of the particle 14b is now highly charged, causing nearby particle 14c to be attracted to it as shown in FIG. 5C. Further particles (e.g., 14d as shown) are further attracted to the ends of the thus formed path. This all occurs rapidly and the attractive/aligning force causing the electrophoresis is believed to become stronger as the path is formed.

Figure 6A:
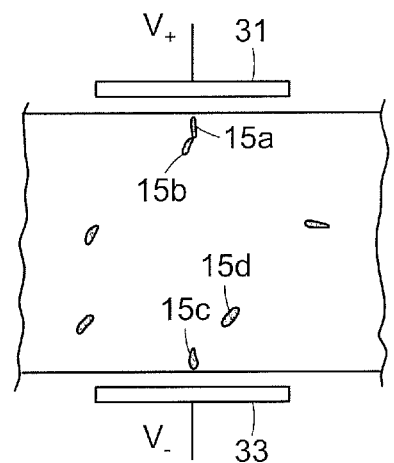
FIGS. 6A and 6B show illustrative diagrammatic views of the composite of FIG. 1 at successive moments after an alternating current (AC) overcharge electric field is applied showing the electrophoresis activity.
Figure 6B:
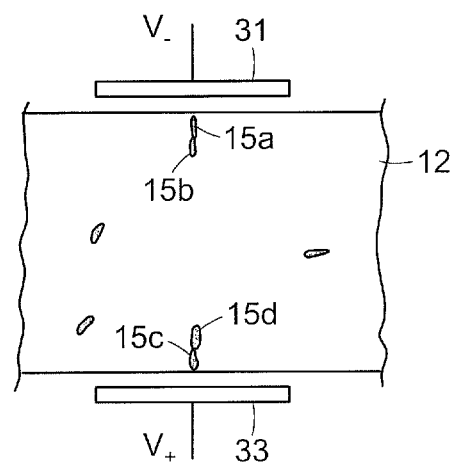

As shown in FIG. 6A, when an AC voltage is applied (again, e.g., 5, 10, 50, 100 or 200 volts or higher), the particles 15a and 15b form along a first side of the composite 12 that has a positive voltage applied to it at a first conductor 31. When a positive voltage charge is then applied at the opposite conductor 33, the conductive particles 15c and 15d then begin to agglomerate from the lower side of the composite as shown in FIG. 6B. By thus alternating the agglomeration process between opposite sides, the AC overvoltage causes a path to be formed that essentially meets in the middle.

Regardless of whether the charge is DC or AC, the higher the voltage, the faster the particles align, and with a relatively low voltage (e.g., about 5 volts or higher), the particles align more slowly, but do still eventually align. This agglomeration phenomenon may be referred to as electrophoretic (in the presence of a DC field) or dielectrophoretic (in the presence of an AC field), both of which are referred to herein as an electrophoresis process.

Figure 7:
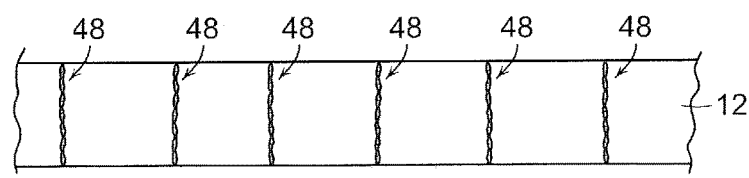
FIGS. 7 and 8 show illustrative diagrammatic views of the conductive pathways formed in the polymeric material.
Figure 8:
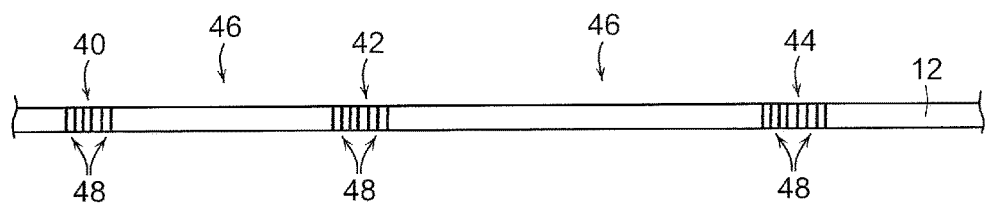

As shown in FIG. 7, following application of a voltage as discussed above over a small area of the composite, multiple conductive paths 38 will be formed through the composite, wherein each conductive path is formed by aligned conductive particles. As shown in FIG. 8, groups of such conductive paths 40, 42, 44 may be separated from one another through selective application of distinct electric fields, permitting selected areas of the composite to be electrically conductive, while other areas 46 of the composite exhibit a high dielectric constant and are therefore not electrically conductive.

In accordance with an embodiment, in one example, to a liquid sample of FLEXcon's V-95 acrylic PSA was added 5% by weight (solids of the V-95 FLEXcon and Arquad blend) of a carbon particle (the Aquablack 5909 carbon particles from Solution Dispersions Inc., Cynthiana KY), which was uniformly dispersed within the polymer. This mixture was coated onto a 2 mil (50 micron) siliconized one side PET film, dried and cured for 10 min in a 160° F. vented laboratory oven, to a dried deposition of 2 mil (50 micron). Upon placing the carbon particle in the V-95 acrylic adhesive composite between two electrodes, and electrically charging the electrodes, conductive structures were formed. It has further been found that the composite has a Z dimension directionality to the signal receptivity. This maintenance of Z dimensionality allows this adhesive to be used in applications as disclosed in U.S. Patent Application Publication No. 2010-0036230 (the disclosure of which is hereby incorporated by reference in its entirety), which teaches the formation of a bio-sensor array fashioned with one continuous layer of adhesive, the disclosure of which is hereby incorporated by reference in its entirety.

Composites in accordance with certain embodiments of the present invention, begin with substantially separated particles uniformly dispersed within, for example, an adhesive. In a subsequent step, an electric field is applied to form the conductive structures. This is a decided advantage as it allows the placement of conductive structures in the Z dimension at specific X,Y, locations thus allowing for a specific point to point electrical contact.

Again, with reference to FIG. 7, multiple parallel paths 48 may be formed simultaneously upon application of a wide electric field. The distance between the paths will depend on the thickness of the material 12 and the concentration of conductive particles as well as any surface irregularities on the outer surfaces of the material 12. As shown in FIG. 8, discrete sets of such paths 40, 42, 44 may be separated from one another providing areas of non-conductive portions 46 there-between through application of electric fields in discrete areas (adjacent sets of paths 40, 42, 44).

The following Examples demonstrate the effect of the conductive particle addition to the binder material discussed above.

Example 1

To a liquid sample of FLEXcon's V-95 acrylic PSA, is added a polar material, Arquad HTL-8 (AkzoNobel), 20% by weight on solids, to this 5% by weight (solids of the V-95 and Arquad blend) of a carbon particle (Aquablack 5909 from Solution Dispersions Inc., Cynthiana KY), which was uniformly dispersed and was designated as Sample 1. This mixture was coated on a 2 mil (50 micron) siliconized one side PET film, dried and cured for 10 min in a 160° F. vented laboratory oven, to a dried deposition of 2 mil (50 micron).

Also prepared at this time was the composite of just the V-95 acrylic adhesive and the Arquad (20% by solids weight), no carbon, as per the disclosure in U.S. Pat. No. 7,651,638 (the disclosure of which is hereby incorporated by reference in its entirety), and was designated as Sample 2. This mixture was also 2 mil (50 microns) siliconized on one side of a PET film, dried and cured for 10 min in a 160° F vented laboratory oven, to a dried deposition of 2 mil (50 microns) and was designated as Sample 2.

Similarly a third sample was prepared consisting of only V-95 acrylic adhesive and 5% carbon, no polar material (Arquad), processed in the same manner as for samples 1 and 2, and was designated as Sample 3.

All three samples were tested on a conductive base material consisting of a carbon filled polymeric film with a surface resistance of ~100 ohms/square, using the experimental product designated EXV-215, 90PFW (as sold by FLEXcon Company, Inc. of Spencer, Mass.). The samples were tested using a QuadTech LCR Model 1900 testing device sold by QuadTech, Inc. of Marlborough, Mass.

In particular, all three samples were tested as per AAMI EC12-2000-4.2.2.1 (modified) and AAMI EC12-2000-4.2.2.4. The AAMI EC12-2000-4.2.2.1 test has an upper limit of 3000 Ohms for the face to face double adhesive part of the test, for a single point and a max average (12 test samples) of 2000 Ohms.

The AAMI EC12-2000-4.2.2.4 calls for retaining less than 100 mV in 5 sec after a 200 DC volt charge, again using a face to double adhesive layer.

Note the Table 1 below, which shows impedance (EC 12-2000-4.2.2.1) tested first; DOR (EC 12-2000-4.2.2.4) was run next on the same samples.

TABLE 1

| Sample | EC12-2000-4.2.2.1 (20 Hz) | EC12-2000-4.2.2.4 |
|---|---|---|
| Sample 1 | 60K Ohms (fail) | 0.0 volts in less than 5 sec. (pass) |
| Sample 2 | 80K Ohms (fail) | 150 volts after 5 sec. (fail) |
| Sample 3 | 40M Ohms (fail) | 0.0 volts in less than 5 sec. (pass) |

Example 2

To determine the signal receptivity of this invention, the samples prepared for Example 1 were tested in accordance to the procedure outlined below. The samples used in testing as per AAMI EC12-2000-4.2.2.1 were used connected in series to a Wave Form Generator (Hewlett Packard 33120A 15 MHz Function/Arbitrary Waveform Generator) and in series an Oscilloscope (BK Precision 100 MHz Oscilloscope 2190). Samples were tested at 3, 10 and 100 Hz; results are given below in Table 2 in % of transmitted signal received.

TABLE 2

|  | Sample 1 | Sample 2 | Sample 3 |
|---|---|---|---|
| 3 Hz | 95+% | 95% | No signal |
| 10 Hz | 95+% | 95% | No signal |
| 100 Hz | 95+% | 95% | No signal |

Example 3

Samples that passed the DOR test (AAMI ECl2-2000-4.2.2.4) were retested for impedance as per AAMI EC12-2000-4.2.2.1 (modified), upon rechecking, samples 1 & 3 had a remarkable change. Samples 1 and 3 now had an impedance of less than 1 K Ohms. In sample 2, the signal receptive medium was unchanged post DOR test; only those samples with the dispersed conductive particles changed. Further, the resulting lower impedance was still anisotropic, i.e., in the Z direction (noting Example 4 as to how the anisotropic property was determined). In addition the parallel capacitance (CP) of the post DOR material actually increases as the Z impedance decreases, as shown below in Table 3.

TABLE 3

|  | Ohms (Z direction) | CP Farads | DC Resistance Ohms |
|---|---|---|---|
| Sample 1 pre-DOR | 60K | 11.0 nF | 80K |
| Sample 1 post-DOR | 860 | 61.6 nF | 790 |
| Sample 3 pre-DOR | 13M | 0.06 nF | 100⁺M |
| Sample 3 post-DOR | 1.9K | 41.2 nF | 1.45K |

Example 4

The anisotropic property was validated by the following test procedure. Signals at 3, 10, 100, Hz were generated, and fed to a first copper shunt, which was placed on the conductive adhesive. A second copper shunt was placed on the same conductive adhesive ~0.004" (100 microns) apart from the first shunt, which was connected (in series) to an oscilloscope. The base substrate was a dielectric material (PET film)

If the Sample 1 adhesive was isotropic it would have been expected to pick up a signal on the oscilloscope. If the Sample 1 adhesive was anisotropic it would have been expected that no signal would be received on the oscilloscope. The result was that no signal was detected.

The electrophoresis result does not appear to rely on the presence of the polar material in the composite. It is believed that the carbon particles are agglomerated by the electric field applied during the DOR test; that the electric field generated by the 200 DC volts being applied across the conductive particle containing SRM and/or the conductive particles just with a PSA (no polar organo-salt), is sufficient to cause the particles to agglomerate together, possibly by inducing an opposite charge on nearby particles.

Figure 9:
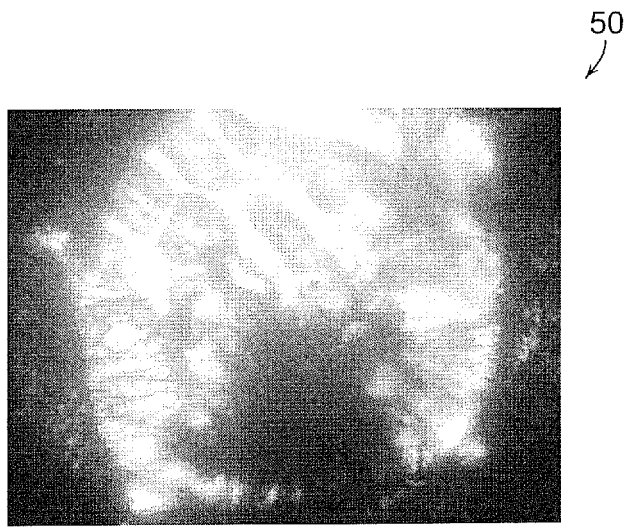
FIGS. 9 and 10 show illustrative micro-photographic views of composites of the invention at different magnifications.

The agglomerated structures spanning from one electrode to the other are the reason an anisotropic conductive PSA is fowled. To examine these agglomerations, reference is made to FIG. 9, which show at 50 an in situ formed conductive structure as per this invention. In particular, FIG. 9 shows a 10× view looking down from the top of a conductive structure. The dark areas are the agglomerated particles the lighter area represents particle poor areas, i.e., places from which particles migrated.

Figure 10:
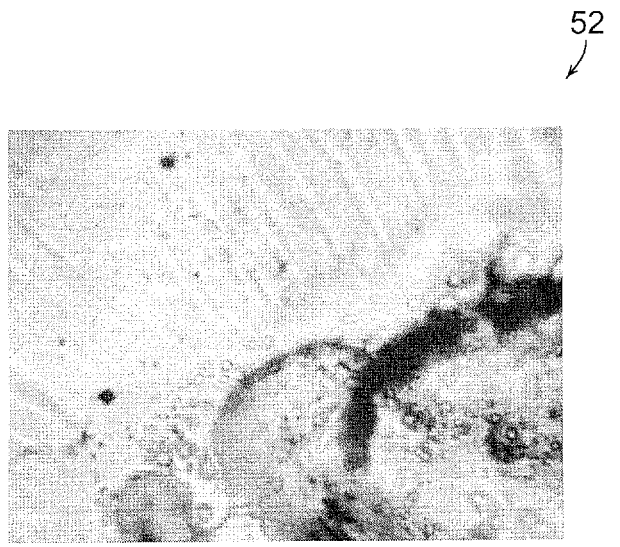

This particle migration effect can be shown in more detail by looking at FIG. 10, which shows at 52 a 100× magnification of a conductive structure, again looking down from the top, but focused more towards the edge, showing the lighter, particle poor, areas. The clear material is the continuous medium, in this case a PSA, FLEXcon's V-95 acrylic adhesive. Note the striations or grooves in the clear V-95 acrylic adhesive, and also note that the few particles remaining are a lined with the striations. The starting material was a uniform particle distribution in continuous medium, thus under the electric field generated by the DOR test, the particles move together to form the conductive structure. Again, this agglomeration phenomenon may be referred to as electrophoretic or in the case of an AC electric field, dielectrophoretic effect, both of which are referred to herein as the electrophoretic process.

It is significant however, that in this case the agglomeration occurs in a non-aqueous high viscosity medium. In accordance with the present invention, the continuous medium is a dielectric and is in full contact with the conductive particles (at the particle loading levels) and the medium is a viscoelastic material, i.e., has a very high viscosity, five plus orders of magnitude higher (as measured in centipoises) than water dispersions (often measured in the only the 10 s of centipoises).

Again, what is postulated here is that, as in the case of particle agglomeration via an electric field in an aqueous continuous medium, a slight charge is induced on a nearby particle near an electrode. With the continuous medium being less polar and more dielectric than water however, a greater charge build-up can occur on a particle in the electric field.

With water as the continuous medium the higher polarity would mitigate the charge build up, further if the applied electric field were increased (higher voltage) electrolysis of the water would become a competing complication. With a PSA (e.g., FLEXcon's V-95 acrylic adhesive) as the continuous medium there is much less charge mitigation and no substantial electro-chemical process that occurs.

This charge build-up on the particle increases the attractive forces between the particle and the electrode, thus drawing the particle to the electrode in spite of the higher viscosity of the continuous medium. Further, the first particle that reaches the electrode forms an incremental high spot on said electrode thus the electric field is moved closer to the other electrode, as more particles join the agglomeration the field strength increase as the distance to the opposite electrode decreases, thus accelerating the agglomeration growth.

The DOR test involves a plane to plane electrode arrangement; after a few conductive structures are formed therefore, the electric field between the two electrodes is mostly dissipated due to the contacts already made between the electrodes. Thus the first structure will form, where there is one spot where the two planes are closer to one another or there is an uneven distribution of carbon such that a slightly higher density of the conductive particles are at one increment, between the plane, in other words that point of least resistance.

As a result using the plane to plane method in forming these structures has some limits as to the position and number of conductive structures formed. When a point-to-plane or point-to-point method is used to introduce the electric field however, more discrete in position and number of conductive structures would be formed as each point has its own electric field which is not readily dissipated when nearby conductive structures are formed.

This was demonstrated by using a lab corona treating device on a conductive substrate that was grounded. The corona treating device acted like a series of point sources to a plane receiving substrate. What resulted was a uniformly distributed conductive structure across the surface of the adhesive.

The testing of the stability of the in situ formed electrically conductive structures was accomplished by placing post DOR test samples in an oven at 160° F. (71° C.) for 16 hours and retesting the impedance (AAMI EC12-2000-4.2.2.1.) and signal receptive properties. In all cases the samples maintained the lower impedance. The conductive particles may be in the form of carbon, and may be provided in a concentration greater than 1% on solids, dry weight.

The use of the composites of the present invention further provides that a conductive layer (such as conductive layers 26 and 28 of FIG. 4) that adjoins the composite for providing a voltage to an electrode, for example, does not need to be formed of an expensive material such as silver / silver chloride (Ag/AgCl) as is required with hydrogels. Hydrogels require such specialized conductive layers because the ionic conductivity of the hydrogel must ionically couple to the electrode. In accordance with the present invention on the other hand, a conductive layer adjacent the composite may be formed of an inexpensive deposited layer (e.g., vacuum deposited or sputter coated) of, for example, conductive particles such as those discussed above but in a higher concentration to form a conductive layer upon deposition. Such less expensive materials may be used for the conductive layer because the mechanism for conduction is not ionic conductivity.

Figure 11:
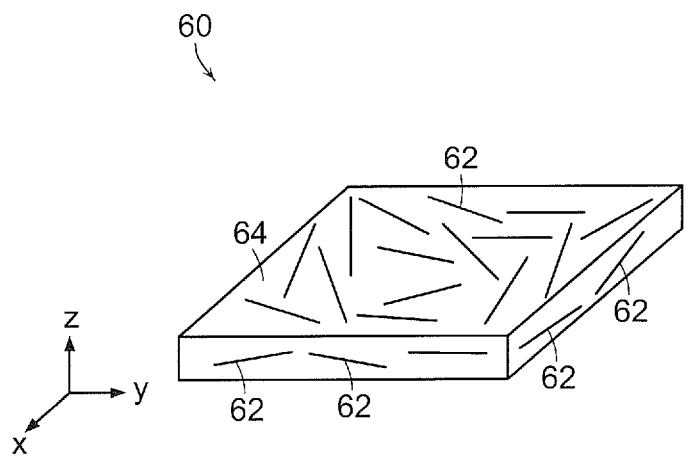
FIGS. 11 and 12 show illustrative diagrammatic views of composites of a further embodiment of the invention before and after electrophoresis providing electrical conductivity in multiple dimensions.
Figure 12:
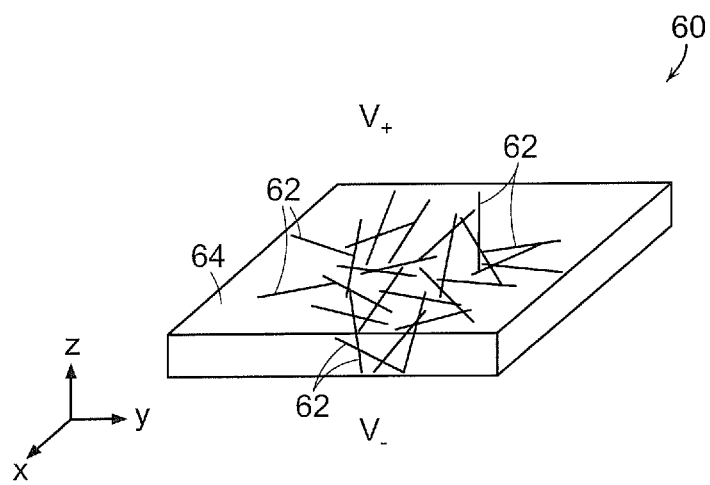

As shown in FIG. 11, composites of further embodiments of the invention may undergo electrophoresis in multiple directions. For example, a composite 60 may include particles having very large aspect ratios (upwards of 1000 to 1) such as carbon nanotubes 62 dispersed within a dielectric material 64 as shown in FIG. 11. In the presence of an electric field that is applied in the Z direction (as shown at 66 in FIG. 12), the particles agglomerate but because the particles are so long, they become entangled with one another when agglomeration occurs. This results in the particles not only providing electrical conductivity in the Z direction, but also providing electrical conductivity in the X and Y directions as well due to the entangled mass of particles extending in the X and Y directions as well as the Z direction as shown in FIG. 12.

Example 5

In accordance with a further example therefore, an adhesive mixture including FLEXcon's V-95 acrylic adhesive, a polar material (Arquad I-ITL-8 sold by AkzoNobel, 20% solids on solids of the V-95 adhesive, and 0.04% single walled semi-conductive carbon nanotubes (CNTs). The mixture was provided in a 3% solids paste in a 72/28 solvent blend isopropyl alcohol / n-butyl alcohol (sold by Southwest Nanotechnologies of 2501 Technology Place, Norman, Okla. The mixture was sonicated for 30 minutes to evenly disperse the CNTs throughout the adhesive/arquad premixture.

The mixture was then coated, dried and cured as discussed above to a 2 mil (50 micron) dried thickness. The adhesive composites were made and tested as discussed above. The results were that the pre-DOR test (as per EC12-2000-4.2.2.1) showed an impedance of 100 k Ohms. The DOR test (as per EC12-2000-4.2.2.4) was pass, and that the impedance post EC12-2000-4.2.2.1 was 5 K Ohms. The signal receptivity was tested as in Example 1 to be both 95% before and after DOR. The anisotropy test as discussed above with respect to Example 3, found that there was an X and Y conductivity component to the composite post DOR. It is expected that more uniform istropic conductive coatings may be formed.

Applications calling for a conductive polymeric contact material such as a sealing or attaching material to bring an EMF shield to ground, and new ways of making membrane switch devices may all benefit from composites of the present invention. Other applications that require or may benefit from a conformable electrical contact where the interface between the electrode and an active layer (such as in photovoltaics or organic light emitting diodes) may employ composites of the present invention. Moreover, the possibility of using substantially lower concentrations of conductive particles such as nano-conductive particles, provides the possibility of developing clear conductive coatings.

Example 6

As noted above, for pressure sensitive adhesives, if the particle concentration is high enough to form a network in which particle-to-particle contact is maintained then there is little chance that the dielectric material (e.g., elastomer) of the adhesive component is present in high enough concentrations to flow out to make surface-to-surface contact between the substrates and an electrode, i.e., act as an adhesive. In a further example, to the dielectric material of Sample 1 (the V-95 PSA and polar material) was added 25% by weight of the carbon particles of Sample 1. The composite was then coated and dried onto a polyester based siliconized release liner to a 2 mil (50 micron) dry deposition. The resulting coating had substantially no measurable PSA properties (tack, peel, shear). An electrically conductive network, however, had formed in the composite, and this composite was found to have a DC resistance of about 100 Ohms both before and after electrophoresis.

Those skilled in the art will appreciate that numerous modifications and variations may be made to the above disclosed embodiments without departing from the spirit and scope of the present invention.

What is claimed is:

1. A method of forming an electrically conductive composite having a thickness in a z direction that is substantially less than a length in an x direction and a width in a y direction, said method comprising the steps of:
    providing a first dielectric material and a second conductive material that is substantially dispersed within the first dielectric material,
    said first dielectric material being a high viscosity viscoelastic material,
    said second conductive material including particles having a surface energy greater than a surface energy of the first dielectric material, said particles being substantially smaller than the thickness of the composite, and said particles remaining suspended within said first dielectric material in a concentration insufficient to provide particle-to-particle electrical conductivity through the composite in the z direction; and applying an electric field through at least a portion of the combined first dielectric material and second conductive material such that the second conductive material undergoes electrophoresis and forms at least one electrically conductive path through the electrically conductive composite along the direction of the applied electric field while the first dielectric material remains highly viscoelastic, wherein the high viscosity viscoelastic material has a viscosity of at least five orders of magnitude higher than 10 cp.

2. The method as claimed in claim 1, wherein said first dielectric material includes a polymeric material.

3. The method as claimed in claim 1, wherein said particles formed of any of carbon powder, flakes, granules or nanotubes.

4. The method as claimed in claim 3, wherein the carbon is in the form of graphite.

5. The method as claimed in claim 1, wherein said have densities within the range of about 0.35 g/cm3 and about 1.20 g/cm3.

6. The method as claimed in claim 1, wherein said electrically conductive particles have densities within the range of about 0.5 g/cm3 and about 1.0 g/cm3.

7. The method as claimed in claim 1, wherein the conductive particles are randomly distributed within the composite prior to application of the electric field.

8. The method as claimed in claim 1, wherein said step of applying an electric field through at least a portion of the combined first dielectric material and second conductive material such that the second conductive material undergoes electrophoresis, forms a plurality of independent conductive paths through the electrically conductive composite along the direction of the applied electric field.

9. A method of forming an electrically conductive composite having a thickness in a z direction that is substantially less than a length in an x direction and a width in a y direction, said method comprising the steps of:

providing a highly viscoelastic dielectric material;

dispersing a conductive material within the dielectric material, said conductive material including particles having a surface energy greater than a surface energy of the dielectric material, said particles being substantially smaller than the thickness of the electrically conductive composite, and said particles remaining suspended within said dielectric material in a concentration insufficient to provide particle-to-particle electrical conductivity through the composite in the z direction;

providing the combined conductive and dielectric material between first and second electrically conductive electrodes;

applying an electric field through the combined conductive and dielectric material using the first and second electrically conductive electrodes such that the conductive material undergoes electrophoresis and forms at least one electrically conductive path through the combined conductive and dielectric material along the direction of the applied electric field between the first and second conductive materials, said electrically conductive path being formed by at least a portion of the conductive material while the dielectric material remains highly viscoelastic, wherein the highly viscoelastic dielectric material has a viscosity of at least five orders of magnitude higher than 10 cp; and applying the electrically conductive composite as a conductive adhesive to a substrate.

10. The method as claimed in claim 9, wherein said dielectric material includes an acrylic pressure sensitive adhesive.

11. The method as claimed in claim 9, wherein said particles are formed of any of carbon powder, flakes, granules or nanotubes.

12. The method as claimed in claim 11, wherein the carbon is in the form of graphite.

13. The method as claimed in claim 9, wherein said particles have densities within the range of about 0.35 g/cm3 and about 1.20 g/cm3.

14. The method as claimed in claim 9, wherein said electrically conductive particles have densities within the range of about 0.5 g/cm3 and about 1.0 g/cm3.

15. The method as claimed in claim 9, wherein the conductive particles are randomly distributed within the composite prior to application of the electric field.

16. The method as claimed in claim 9, wherein said step of applying an electric field through the composite using the first and second electrically conductive electrodes involves forming a plurality of independent conductive paths through the composite along the direction of the applied electric field.

17. A method of forming an electrically conductive composite having a thickness in a z direction that is substantially less than a length in an x direction and a width in a y direction, said method comprising the steps of:

dispersing electrically conductive particles within an acrylic pressure sensitive adhesive, said electrically conductive particles having a surface energy greater than a surface energy of the acrylic pressure sensitive adhesive, said electrically conductive particles being substantially smaller than the thickness of the electrically conductive composite, and said electrically conductive particles remaining suspended within acrylic pressure sensitive adhesive in a concentration insufficient to provide particle-to-particle electrical conductivity through the acrylic pressure sensitive adhesive in the z direction;

applying an electric field through the acrylic pressure sensitive adhesive that includes the electrically conductive particles dispersed within the acrylic pressure sensitive adhesive, said electric field being applied from a first side of the composite to a second side of the acrylic pressure sensitive adhesive such that the electrically conductive particles undergo electrophoresis and form at least one electrically conductive path through the acrylic pressure sensitive adhesive along the direction of the applied electric field, said electrically conductive path being formed by at least some of the electrically conductive particles material while the acrylic pressure sensitive adhesive remains highly viscoelastic and suitable for use as a pressure sensitive adhesive, and wherein the acrylic pressure sensitive adhesive has a viscosity of at least five orders of magnitude higher than 10 cp.

18. The method as claimed in claim 17, wherein said acrylic pressure sensitive adhesive is represented as:

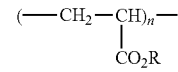

where R is an ethyl, or a butyl or a 2-ethylhexyl and n is a number of repeating units.

19. The method as claimed in claim 17, wherein said electrically conductive particles are formed of any of carbon powder, flakes, granules or nanotubes.

\* \* \* \* \*